(12) United States Patent
Henson et al.

(10) Patent No.: US 9,299,793 B2
(45) Date of Patent: Mar. 29, 2016

(54) SEMICONDUCTOR DEVICE WITH A FIELD PLATE TRENCH HAVING A THICK BOTTOM DIELECTRIC

(71) Applicant: International Rectifier Corporation, El Segundo, CA (US)

(72) Inventors: Timothy D. Henson, Torrance, CA (US); Kapil Kelkar, Torrance, CA (US); Ljubo Radic, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/267,760

(22) Filed: May 1, 2014

(65) Prior Publication Data

US 2014/0339669 A1 Nov. 20, 2014

Related U.S. Application Data

(60) Provisional application No. 61/824,235, filed on May 16, 2013.

(51) Int. Cl.

| H01L 21/336 | (2006.01) |
| H01L 21/3205 | (2006.01) |
| H01L 29/94 | (2006.01) |
| H01L 29/40 | (2006.01) |
| H01L 29/78 | (2006.01) |
| H01L 29/66 | (2006.01) |
| H01L 21/765 | (2006.01) |
| H01L 21/308 | (2006.01) |

(52) U.S. Cl.
CPC .......... *H01L 29/407* (2013.01); *H01L 21/3083* (2013.01); *H01L 21/765* (2013.01); *H01L 29/66674* (2013.01); *H01L 29/7801* (2013.01)

(58) Field of Classification Search
CPC .............. H01L 29/407; H01L 29/4236; H01L 29/66704; H01L 29/7397; H01L 29/7827
USPC .......... 438/259, 270, 271, 589; 257/328, 330, 257/341
See application file for complete search history.

(56) References Cited

U.S. PATENT DOCUMENTS

| 5,300,450 | A | * | 4/1994 | Shen et al. .................... 438/243 |
| 6,444,528 | B1 | | 9/2002 | Murphy |
| 7,012,005 | B2 | | 3/2006 | Lichtenberger |
| 8,101,484 | B2 | | 1/2012 | Bencuya |
| 8,143,123 | B2 | | 3/2012 | Grebs |
| 8,143,124 | B2 | | 3/2012 | Challa |
| 8,252,647 | B2 | | 8/2012 | Lee |
| 2005/0173758 | A1 | * | 8/2005 | Peake et al. .................... 257/330 |
| 2007/0108511 | A1 | * | 5/2007 | Hirler ............................ 257/328 |
| 2007/0181975 | A1 | * | 8/2007 | Koops et al. ................... 257/559 |
| 2009/0085107 | A1 | | 4/2009 | Hshieh |
| 2010/0244125 | A1 | | 9/2010 | Sonsky |
| 2010/0264486 | A1 | | 10/2010 | Denison |
| 2011/0254088 | A1 | | 10/2011 | Darwish |
| 2012/0309200 | A1 | | 12/2012 | Tay |
| 2013/0248987 | A1 | | 9/2013 | Okuhata |

* cited by examiner

*Primary Examiner* — Hsien Ming Lee
(74) *Attorney, Agent, or Firm* — Farjami & Farjami LLP

(57) ABSTRACT

Disclosed is a power device, such as a power MOSFET, and methods for fabricating same. The device includes a field plate trench. The device further includes first and second trench dielectrics inside the field plate trench. The device also includes a field plate situated over the first trench dielectric and within the second trench dielectric. A combined thickness of the first and second trench dielectrics at a bottom of the field plate trench is greater than a sidewall thickness of the second trench dielectric.

20 Claims, 8 Drawing Sheets

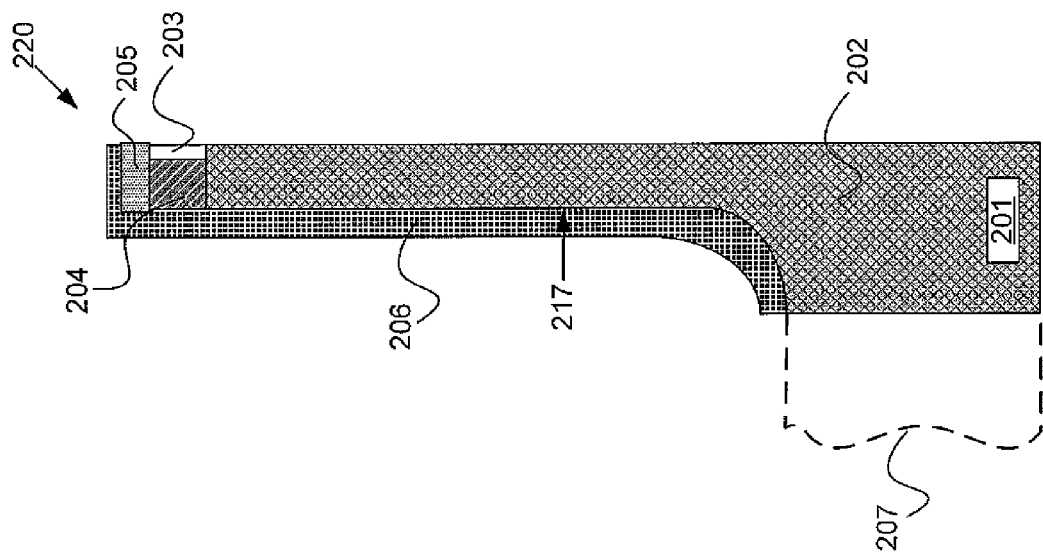
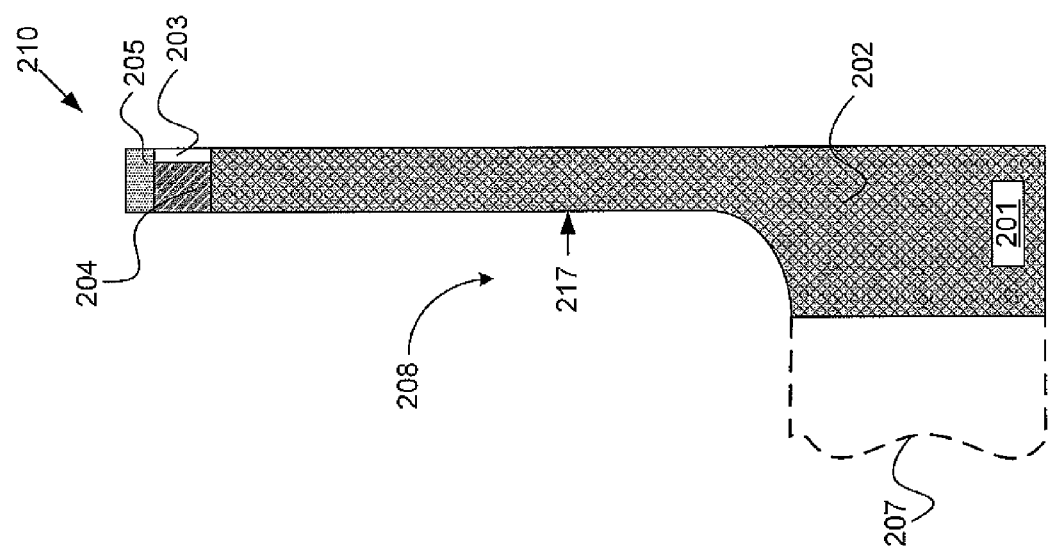

… (US 9,299,793 B2)

SEMICONDUCTOR DEVICE WITH A FIELD PLATE TRENCH HAVING A THICK BOTTOM DIELECTRIC

BACKGROUND

The present application claims the benefit of and priority to U.S. Provisional Patent Application Ser. No. 61/824,235, filed on May 16, 2013, and entitled "Semiconductor Trenches Having Thick Bottom Dielectrics Suitable for Field Plates." The disclosure of the above application is hereby incorporated fully by reference into the present application.

Power semiconductor devices, such as metal-oxide semiconductor field-effect transistors (MOSFET), are widely used in a variety of electronic devices and systems. Examples of these devices and systems include switches, DC to DC converters, and power supplies. In power devices, improving performance characteristics such as breakdown voltage, ON resistance ($R_{dson}$), and output capacitance are increasingly important. For example, it is desirable to lower $R_{dson}$, increase breakdown voltage, and decrease output capacitance, particularly using methods which do not add to the thermal budget for fabrication of semiconductor devices.

Conventional methods traditionally optimize one performance characteristic at the expense of another. For example, a semiconductor device may reduce $R_{dson}$ at the expense of lowering the breakdown voltage of the device. As such, there is a need for a structure and method for power MOSFETs that can overcome the deficiencies in the art.

SUMMARY

A semiconductor device with a field plate trench having a thick bottom dielectric, substantially as shown in and/or described in connection with at least one of the figures, and as set forth more completely in the claims.

BRIEF DESCRIPTION OF THE DRAWINGS

FIG. 2A illustrates a cross-sectional view of an embodiment of the invention, corresponding to an initial step in the flowchart in FIG. 1.

FIG. 2B illustrates a cross-sectional view of an embodiment of the invention, corresponding to an intermediate step in the flowchart in FIG. 1.

DETAILED DESCRIPTION

Figure 1:
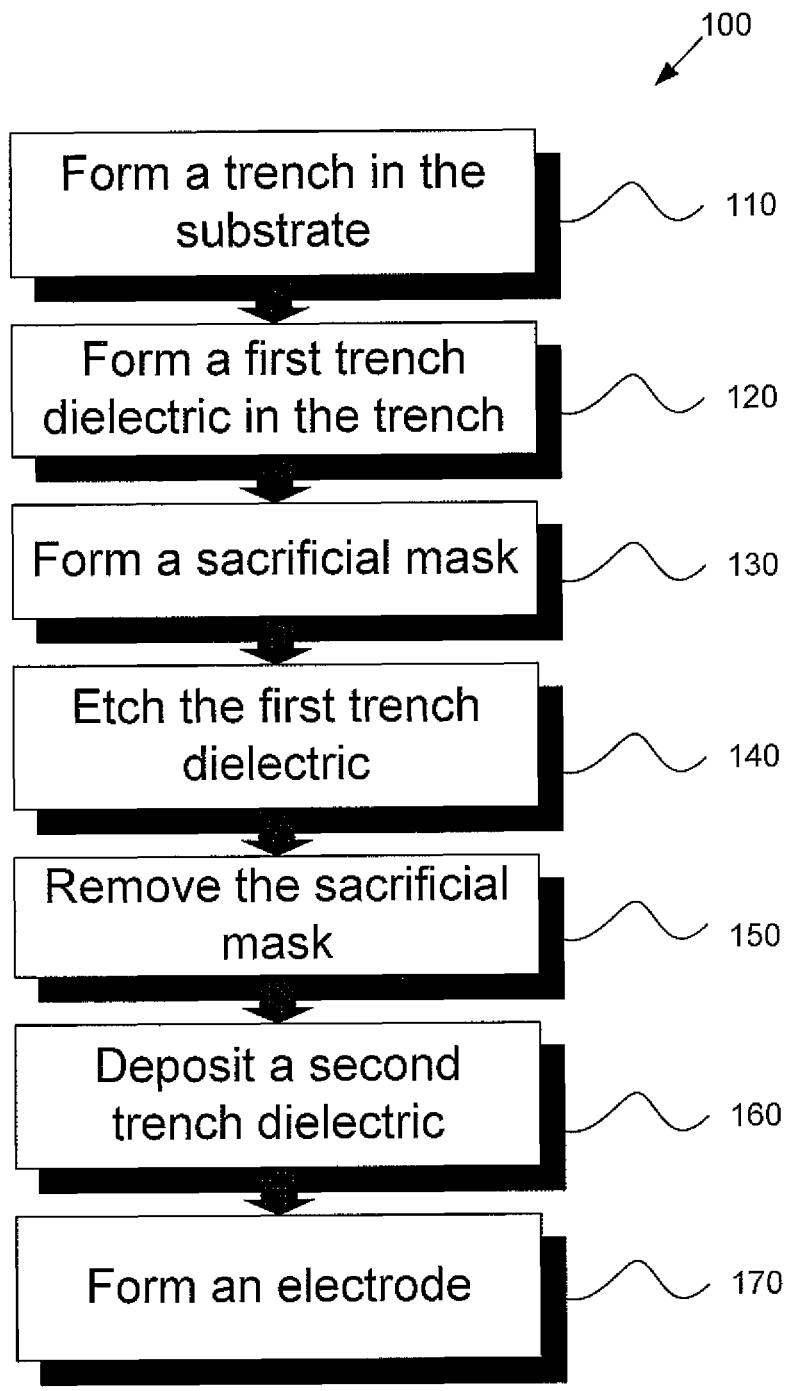
FIG. 1 shows a flowchart illustrating the steps taken to implement an embodiment of the present invention.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

FIG. 1 shows a flowchart illustrating a method for fabricating a power MOSFET according to an embodiment of the present invention. Certain details and features have been left out of flowchart 100 that are apparent to a person of ordinary skill in the art. For example, a step may consist of one or more substeps or may involve specialized equipment or materials, as known to a person of ordinary skill in the art. Steps 110 through 170 indicated in flowchart 100 are sufficient to describe one implementation of the present embodiment; however, other implementation of the present embodiment may utilize steps different from those shown in flowchart 100.

Structures 210 through 270 in FIGS. 2A through 2G illustrate the result of performing steps 110 through 170 of flowchart 100, respectively. For example, structure 210 shows a cross-section of a semiconductor structure after processing step 110, structure 220 shows the cross-section of the structure after processing step 120, and so forth.

Referring to step 110 in FIG. 1 and structure 210 in FIG. 2A, structure 210 corresponds to a cross-section of semiconductor substrate 201 after forming field plate trench 208 in semiconductor substrate 201. Semiconductor substrate 201 can be, for example, an N type or a P type silicon substrate. Semiconductor substrate 201 includes drift region 202, body junction 204 and hard mask dielectric 205. Structure 210 further includes gate trench 203, which is only partially represented in FIG. 2A. Gate trench 203 may, for example, include a gate electrode and be lined by a gate dielectric. Although gate trench 203 and body junction 204 are shown in FIG. 2A, in some embodiments of the present invention gate trench 203 and body junction 204 may not have been formed before step 110 of flowchart 100. It is noted that dashed lines 207 in FIG. 2A, as well as in other Figures in the present application, indicate that semiconductor substrate 201 extends beyond the cross-sections specifically shown in the drawings of the present application.

Forming field plate trench 208 can be done by, for example, depositing hard mask dielectric 205 over semiconductor substrate 201, body junction 204, and gate trench 203. Hard mask dielectric 205 may include, for example, tetraethyl orthosilicate (TEOS), silicon dioxide ($SiO_2$), or any other suitable material. Photoresist can be deposited and patterned over hard mask dielectric 205 and patterns can be formed in hard mask dielectric 205. Thus, hard mask dielectric 205 can be used as a hard mask to form field plate trench 208 in semiconductor substrate 201. Structure 210 includes sidewall 217 of field plate trench 208, however, structure 210 includes another sidewall similar to sidewall 217 on an opposite side of field plate trench 208, which is not shown in the present drawings to simplify illustration of the present inventive concepts. In one embodiment, field plate trench 208 can be formed so that the sidewalls, including sidewall 217, are substantially vertical, which can be, for example, between 80 to 90 degrees with respect to a bottom surface of semiconductor substrate 201.

Referring to step 120 in FIG. 1 and structure 220 in FIG. 2B, structure 220 shows structure 210 after forming first trench dielectric 206 in field plate trench 208. In the present embodiment, first trench dielectric 206 is formed by depositing at least one of, for example, TEOS, or another suitable dielectric material, over hard mask dielectric 205 and into field plate trench 208. However, in other embodiments, first trench dielectric 206 may be formed by thermally growing first trench dielectric 206 in field plate trench 208. A thickness of first trench dielectric 206 formed in field plate trench 208 is determined based on a desired combined thickness 211 of a combination of first trench dielectric 206 and second trench dielectric 209, which is discussed further below. For example, if the desired combined thickness 211 is 1.0 µm, and second trench dielectric 209 is to be deposited to have a thickness of 0.5 then the thickness of first trench dielectric 206 would also be 0.5 µm.

Figure 2D:
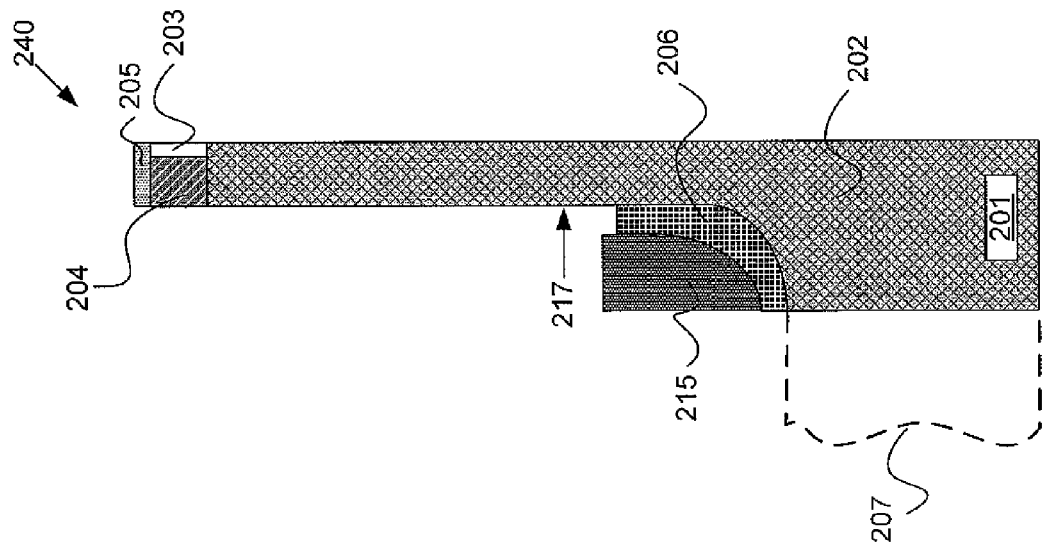
FIG. 2D illustrates a cross-sectional view of an embodiment of the invention, corresponding to an intermediate step in the flowchart in FIG. 1.
Figure 2C:
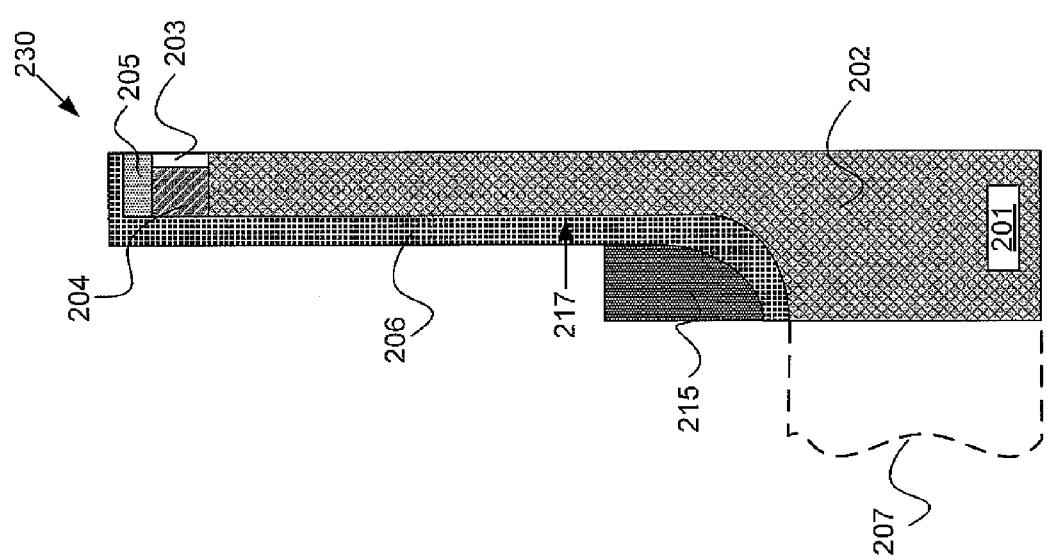
FIG. 2C illustrates a cross-sectional view of an embodiment of the invention, corresponding to an intermediate step in the flowchart in FIG. 1.

Referring to step 130 in FIG. 1 and structure 230 in FIG. 2C, structure 230 shows structure 220 after forming sacrificial mask 215 in field plate trench 208. Sacrificial mask 215 may be formed by first depositing sacrificial mask material into field plate trench 208. The sacrificial mask material may be deposited to completely fill field plate trench 208, or in some embodiments, may only partially fill field plate trench 208. After depositing the sacrificial mask material, the sacrificial mask material is etched to form sacrificial mask 215 at a desired depth in field plate trench 208. The desired depth of sacrificial mask 215 is chosen to be substantially equal to the desired height of first trench dielectric 206 on sidewall 217 after first trench dielectric 206 is etched, which is discussed further below.

The etching of the sacrificial mask material may be done by anisotropic etching or isotropic etching, depending on the sacrificial mask material used and the dielectric material used for first trench dielectric 206. In other words, the sacrificial mask material used should allow for selective etching, meaning that when etching the sacrificial mask material to form sacrificial mask 215, first trench dielectric 206 should not be simultaneously etched. As such, it may be desirable for sacrificial mask material to have high etch selectivity. For example, sacrificial mask 215 may include bottom anti-reflective coating (BARC), nitride, a high-k dielectric, or another sacrificial mask material.

Referring to step 140 in FIG. 1 and structure 240 in FIG. 2D, structure 240 shows structure 230 after etching first trench dielectric 206. As described above, in the present embodiment, first trench dielectric 206 is etched to the desired height on sidewall 217 dependent substantially on the desired depth of sacrificial mask 215. The etching of first trench dielectric 206 may be done by anisotropic or isotropic etching. The etching of first trench dielectric 206, in some embodiments, may also at least partially etch hard mask dielectric 205 but would not completely etch hard mask dielectric 205, due to the thickness of hard mask dielectric 205 in the present embodiment. In some embodiments, however, etching can be done in order to fully remove hard mask dielectric 205, but as seen in FIGS. 2A, 2B, 2C, 2D, 2E, and 2F ("FIGS. 2A-2F"), hard mask dielectric 205 protects against etching semiconductor substrate 201, body junction 204, and gate trench 203.

Figure 2F:
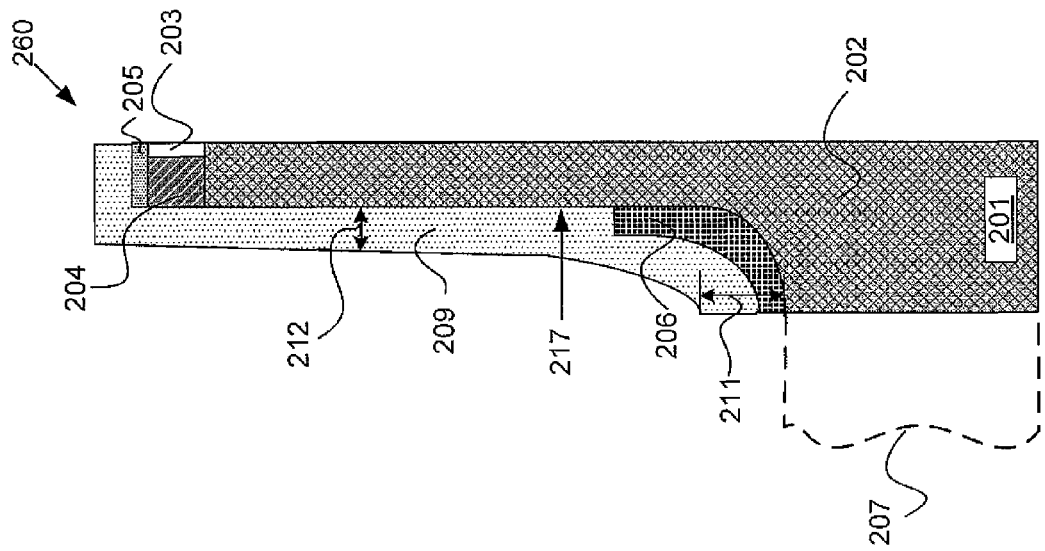
FIG. 2F illustrates a cross-sectional view of an embodiment of the invention, corresponding to an intermediate step in the flowchart in FIG. 1.
Figure 2E:
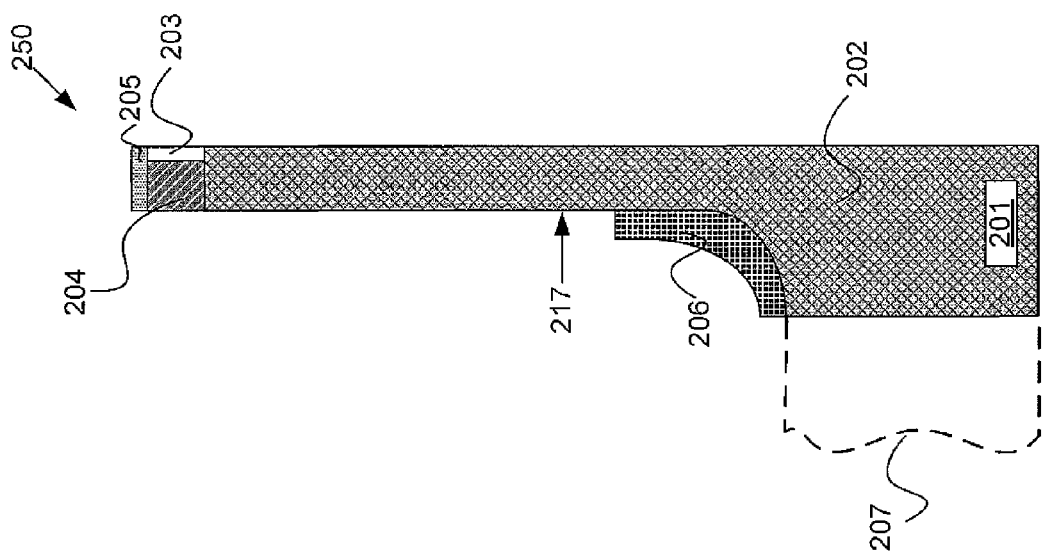
FIG. 2E illustrates a cross-sectional view of an embodiment of the invention, corresponding to an intermediate step in the flowchart in FIG. 1.

Referring to step 150 in FIG. 1 and structure 250 in FIG. 2E, structure 250 shows structure 240 after removing sacrificial mask 215. In the present embodiment, sacrificial mask 215 may be removed by isotropically etching sacrificial mask 215, however, in other embodiments sacrificial mask 215 may be etched anisotropically, or by any other suitable method. However, as described above, the etching of sacrificial mask should be done selectively, depending on the sacrificial mask material used and the dielectric material used for first trench dielectric 206, such that etching sacrificial mask 215 does not etch first trench dielectric 206.

Referring to step 160 of FIG. 1 and structure 260 in FIG. 2F, structure 260 shows structure 250 after depositing second trench dielectric 209 in field plate trench 208. In the present embodiment, second trench dielectric 209 is formed by depositing at least one of, for example, TEOS, or another suitable dielectric material, into field plate trench 208. Second trench dielectric 209 may include a trench dielectric material that is different than the trench dielectric material used for first trench dielectric 206. However, in other embodiments, second trench dielectric 209 may include a trench dielectric material that is the same as the trench dielectric material used for first trench dielectric 206. Upon deposition of second trench dielectric 209, combined thickness 211 of first trench dielectric 206 and second trench dielectric 209 is formed at the bottom of field plate trench 208. In some embodiments, combined thickness 211 may be between 0.5 µm to 1.0 µm, for example.

Additionally, during deposition, second trench dielectric 209 builds up on sidewall 217 of field plate trench 208 to form sidewall thickness 212. Combined thickness 211 of first and second trench dielectrics 206 and 209, respectively, is greater than sidewall thickness 212 of second trench dielectric 209. In some embodiments, combined thickness 211 can be, for example, at least 120% to 140% greater than sidewall thickness 212. In some embodiments, second trench dielectric 209 on sidewall 217 may taper from the bottom of sidewall 217 to the top of sidewall 217, such that the thickness of second trench dielectric 209 is less at the top of sidewall 217 than at the bottom.

Figure 2G:
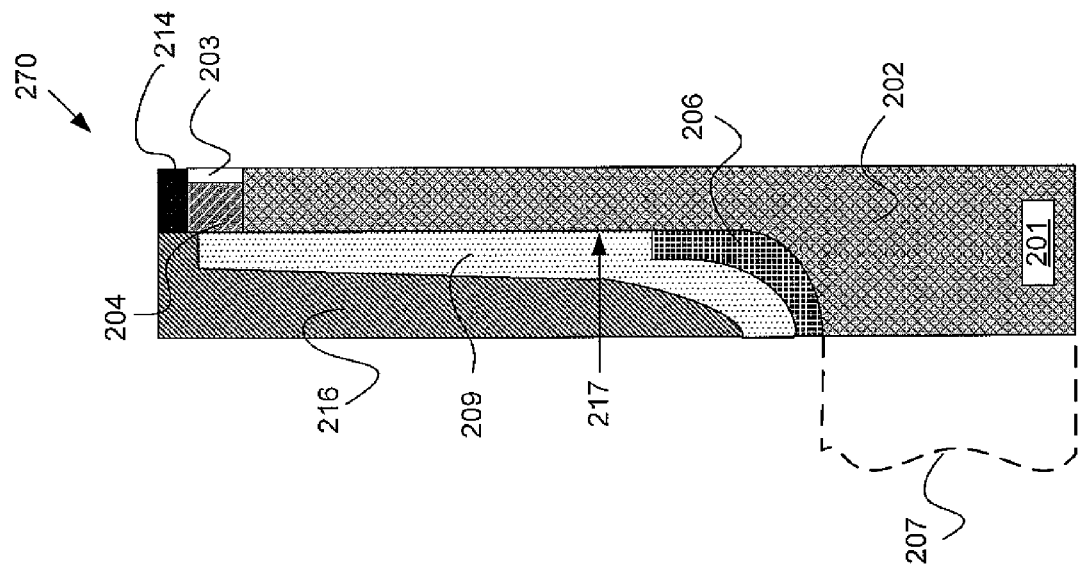
FIG. 2G illustrates a cross-sectional view of an embodiment of the invention, corresponding to a final step in the flowchart in FIG. 1.

Referring to step 170 of FIG. 1 and structure 270 in FIG. 2G, structure 270 shows structure 260 after forming field plate 216 in field plate trench 208. In the present embodiment, field plate 216 is formed by depositing field plate material into field plate trench 208 and etching field plate material to form field plate 216 of desired size. As a result of depositing second trench dielectric 209 without etching second trench dielectric 209, field plate 216 is formed with a substantially rounded bottom surface in the present embodiment. In addition, structure 270 further includes source electrode 214 situated over body junction 204 and gate trench 203. Although body junction 204 and gate trench 203 were formed prior to field plate trench 208 in the present embodiment, in other embodiments these features may be formed at another stage of the fabrication process such as, for example, after forming field plate 216. Furthermore, in other implementations, such as where a gate electrode has not been formed prior to step 170, an additional electrode or electrodes may also be formed in field plate trench 208, such as, for example, a gate electrode.

A power device, such as a power MOSFET, using a trench structure of the present embodiment offers several benefits and improved performance characteristics. For example, because bottom thickness 211 is greater than sidewall thickness 212, breakdown voltage of the power MOSFET is increased. In addition, due to the fact that the electric field is greatest between drift region 202 and field plate 216, the increased bottom thickness 211 reduces the electric field strength where it is most needed (i.e. at trench bottom) without requiring an increased thickness of trench dielectric 206 on sidewall 217. Due to the lower electric field, the breakdown voltage is increased. Thus, the doping levels in the semiconductor device can be higher than conventional devices, resulting in a reduced $R_{dson}$ of the power MOSFET.

Moreover, the trench structure of the present invention results in a reduction in output capacitance of the power MOSFET. It is noted that while the drawings of the present embodiment have been discussed primarily in relation to a power MOSFET, the present inventive concepts apply to other semiconductor devices as well.

Figure 3:
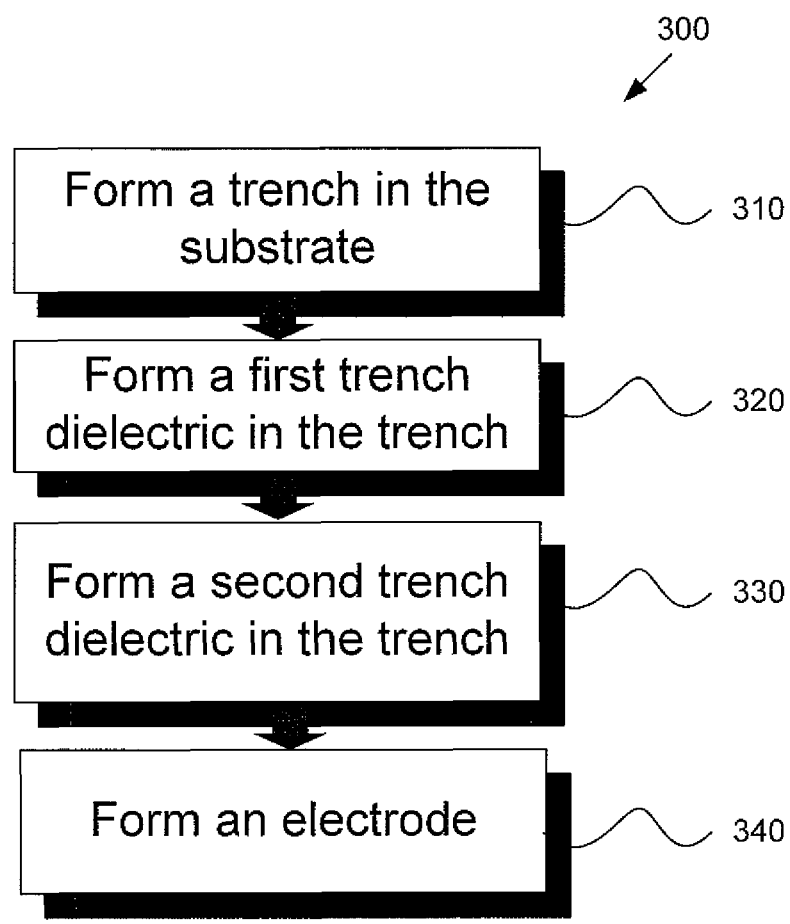
FIG. 3 shows a flowchart illustrating the steps taken to implement another embodiment of the present invention.

FIG. 3 shows a flowchart illustrating a method for fabricating a power MOSFET according to another embodiment of the present invention. Certain details and features have been left out of flowchart 300 that are apparent to a person of ordinary skill in the art. For example, a step may consist of one or more substeps or may involve specialized equipment or materials, as known to a person of ordinary skill in the art. Steps 310 through 340 indicated in flowchart 300 are sufficient to describe one implementation of the present embodiment; however, other implementations of the present embodiment may utilize steps different from those shown in flowchart 300.

Structures 410 through 440 in FIGS. 4A through 4D illustrate the result of performing steps 310 through 340 of flowchart 300, respectively. For example, structure 410 shows a cross-section of a semiconductor structure after processing step 310, structure 420 shows the cross-section of the structure after processing step 320, and so forth.

Figure 4B:
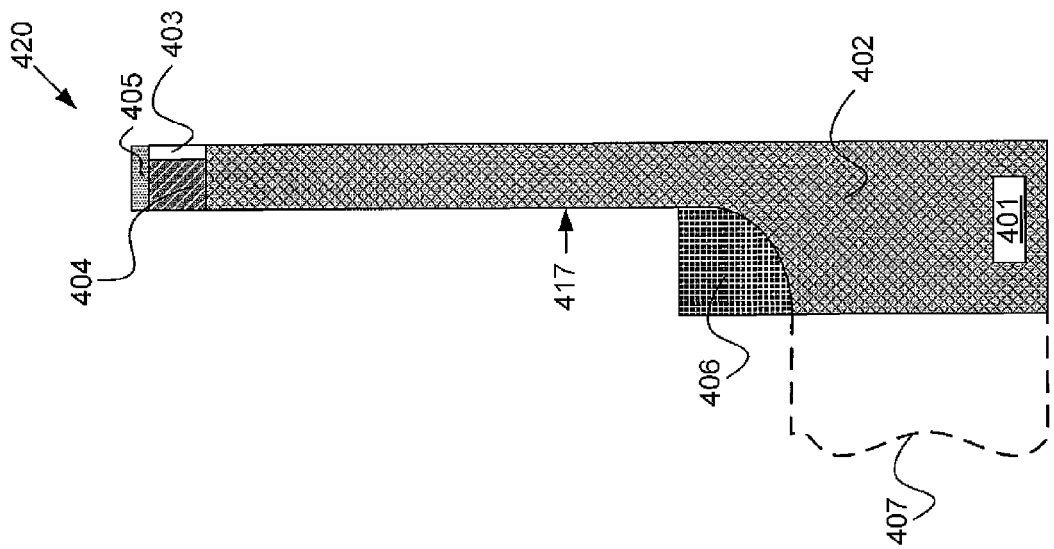
FIG. 4B illustrates a cross-sectional view of an embodiment of the invention, corresponding to an intermediate step in the flowchart in FIG. 3.
Figure 4A:
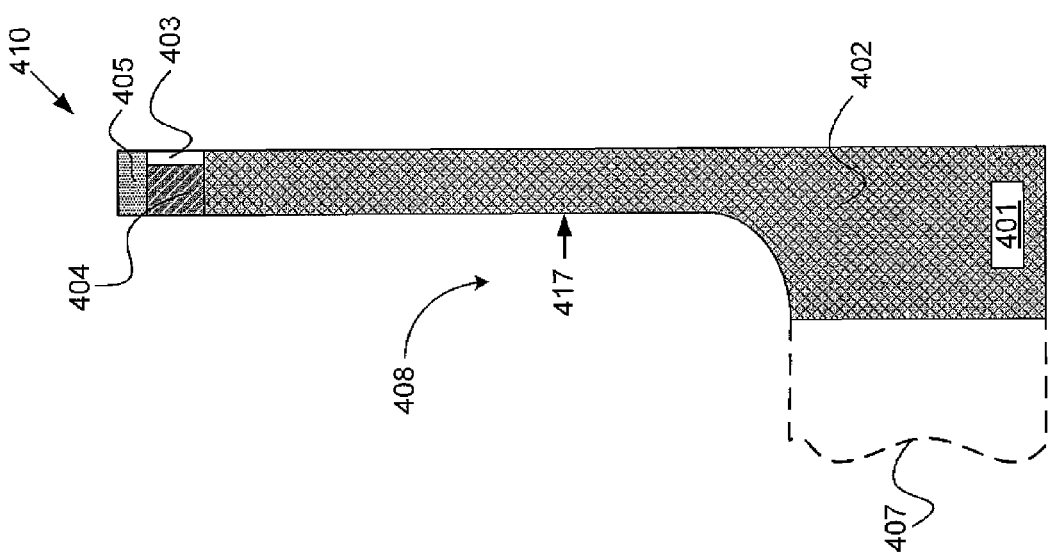
FIG. 4A illustrates a cross-sectional view of an embodiment of the invention, corresponding to an initial step in the flowchart in FIG. 3.

Referring to step 310 in FIG. 3 and structure 410 in FIG. 4A, structure 410 corresponds to a cross-section of semiconductor substrate 401 after forming field plate trench 408 in semiconductor substrate 401. Semiconductor substrate 401 can be, for example, an N type or a P type silicon substrate. Semiconductor substrate 401 includes drift region 402, body junction 404 and hard mask dielectric 405. Structure 410 further includes gate trench 403, which is only partially represented in FIG. 4A. Gate trench 403 may, for example, include a gate electrode and be lined by a gate dielectric. Although gate trench 403 and body junction 404 are shown in FIG. 4A, in some embodiments of the present invention gate trench 403 and body junction 404 may not have been formed before step 310 of flowchart 300. It is noted that dashed lines 407 in FIG. 4A, as well as in other Figures in the present application, indicate that semiconductor substrate 401 extends beyond the cross-sections specifically shown in the drawings of the present application.

Forming field plate trench 408 can be done by, for example, depositing hard mask dielectric 405 over semiconductor substrate 401, body junction 404, and gate trench 403. Hard mask dielectric 405 may include, for example, tetraethyl orthosilicate (TEOS), silicon dioxide ($SiO_2$), or any other suitable material. Photoresist can be deposited and patterned over hard mask dielectric 405 and openings can be formed in hard mask dielectric 405. Thus, hard mask dielectric 405 can be used as a hard mask to form field plate trench 408 in semiconductor substrate 401. Structure 410 includes sidewall 417 of field plate trench 408, however, structure 410 includes another sidewall similar to sidewall 417 on an opposite side of field plate trench 408, which is not shown in the present drawings to simplify illustration of the present inventive concepts. In one embodiment, field plate trench 408 can be formed so that the sidewalls, including sidewall 417, are substantially vertical, which can be, for example, between 80 to 90 degrees with respect to a bottom surface of semiconductor substrate 401.

Referring to step 320 in FIG. 3 and structure 420 in FIG. 4B, structure 420 shows structure 410 after forming first trench dielectric 406 in field plate trench 408. In the present embodiment, first trench dielectric 406 is formed by depositing a dielectric material, such as, for example, TEOS, into field plate trench 408. In some embodiments, first trench dielectric 406 may include another dielectric material. First trench dielectric 406 may be deposited such that first trench dielectric 406 completely fills field plate trench 408, or in other embodiments, may be deposited such that field plate trench 408 is only partially filled by first trench dielectric 406. In the present embodiment, after deposition, first trench dielectric 406 is anisotropically etched to a desired depth which forms a part of combined thickness 211, which is discussed further below.

In other embodiments, first trench dielectric 406 may be isotropically etched, or may be etched by another method. In some embodiments, first trench dielectric 406 may be etched to create a thickness of first trench dielectric 406 of, for example, 0.5 µm to 1.0 µm at the bottom of field plate trench 408. The etching of first trench dielectric 406, in some embodiments, may also at least partially etch hard mask dielectric 405 but would not completely etch hard mask dielectric 405, due to the thickness of hard mask dielectric 405 in the present embodiment. In some embodiments, however, etching can be done in order to fully remove hard mask dielectric 405, but as is appreciated from FIGS. 4A, 4B, 4C, and 4D, hard mask dielectric 405 protects against etching semiconductor substrate 401, body junction 404, and gate trench 403.

Figure 4D:
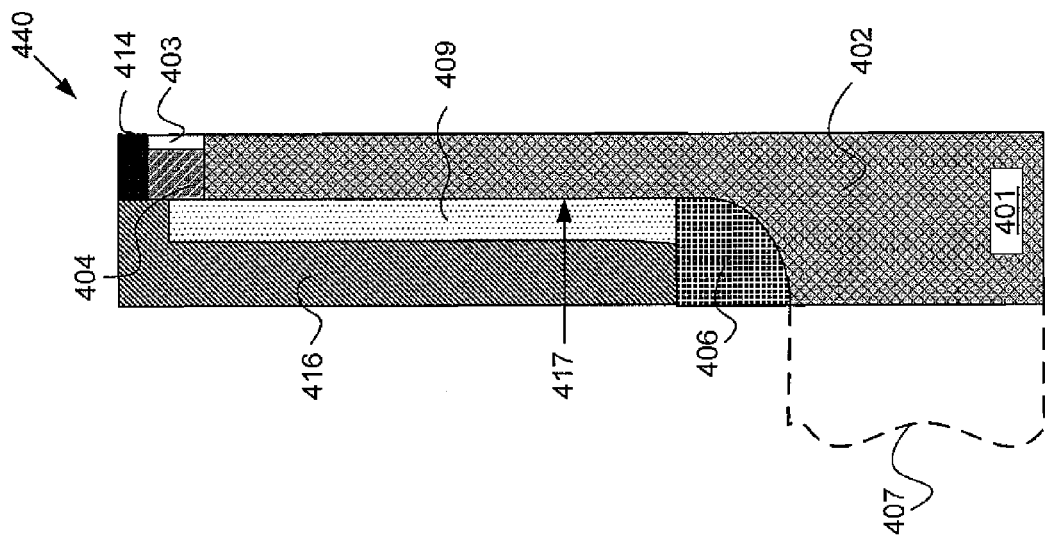
FIG. 4D illustrates a cross-sectional view of an embodiment of the invention, corresponding to a final step in the flowchart in FIG. 3.
Figure 4C:
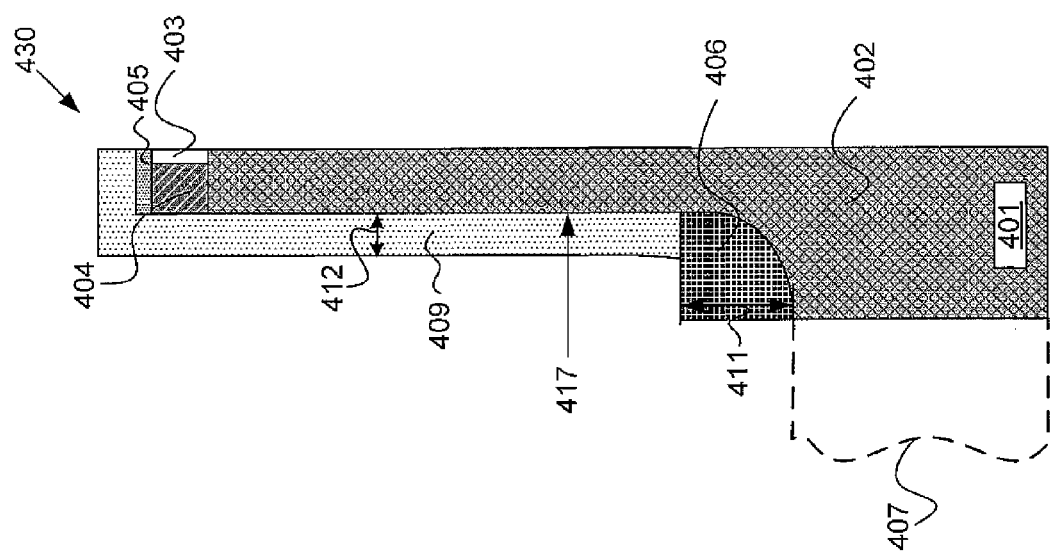
FIG. 4C illustrates a cross-sectional view of an embodiment of the invention, corresponding to an intermediate step in the flowchart in FIG. 3.

Referring to step 330 in FIG. 3 and structure 430 in FIG. 4C, structure 430 shows structure 420 after forming second trench dielectric 409 in field plate trench 408. In the present embodiment, second trench dielectric 409 is formed by depositing at least one of, for example, silicon dioxide, or another suitable dielectric material, into field plate trench 408. However, in some embodiments, second trench dielectric 409 may be thermally grown on sidewall 417 of field plate trench 408. Second trench dielectric 409 may include a dielectric material that is different than the dielectric material used for first trench dielectric 406. However, in other embodiments, second trench dielectric 409 may include a dielectric material that is the same as the dielectric material used for first trench dielectric 406.

Upon deposition of second trench dielectric 409, the combined thickness 411 of first trench dielectric 406 and second trench dielectric 409 is formed at the bottom of field plate trench 408. In the present embodiment, as can be seen in FIGS. 4C and 4D, second trench dielectric 409 is only formed on sidewall 417 and does not add to combined thickness 411. However, in some embodiments, second trench dielectric may be formed over first trench dielectric 406 in addition to on sidewall 417. Combined thickness 411 may be, for example, between 0.5 µm to 1.0 µm. Additionally, during formation, second trench dielectric 409 builds up on sidewall 417 of field plate trench 408 to form sidewall thickness 412. In some embodiments, second trench dielectric 409 may be etched to form a desired sidewall thickness 412 if the sidewall thickness 412 from formation of second trench dielectric 409 is greater than desired.

Combined thickness 411 of first and second trench dielectrics 406 and 409, respectively, is greater than sidewall thickness 412 of second trench dielectric 409. In some embodiments, combined thickness 411 can be, for example, at least 120% to 140% greater than sidewall thickness 412. In some embodiments, second trench dielectric 409 on sidewall 417 may taper from the bottom of sidewall 417 to the top of sidewall 417, such that the thickness of second trench dielectric 409 is less at the top of sidewall 417 than at the bottom.

Referring to step 340 in FIG. 3 and structure 440 in FIG. 4D, structure 440 shows structure 430 after forming field plate 416 in field plate trench 408. In the present embodiment, field plate 416 may be formed by depositing field plate material into field plate trench 408 and etching field plate material to form field plate 416 of desired size. As a result of second trench dielectric 409 being etched to have a substantially flat top surface, field plate 416 has a substantially flat and squared off bottom in the present embodiment. In addition, structure 470 includes source electrode 414 situated over body junction 404 and gate trench 403.

Although body junction 404 and gate trench 403 were formed prior to field plate trench 408 in the present embodiment, in other embodiments these features may be formed at another stage of the fabrication process such as, for example, after forming field plate 416. Furthermore, in other implementations, such as where a gate electrode has not been formed prior to step 340, an additional electrode or electrodes may also be formed in field plate trench 408, such as, for example, a gate electrode.

As with other embodiments of the present invention, a power device, such as a power MOSFET, using a trench structure of the present invention offers several benefits and improved performance characteristics. For example, because bottom thickness 411 is greater than sidewall thickness 412, breakdown voltage of the power MOSFET is increased. In addition, due to the fact that the electric field is greatest between drift region 402 and field plate 416, the increased bottom thickness 411 reduces the electric field strength where it is most needed (i.e. at trench bottom) without requiring an increased thickness of trench dielectric 406 on sidewall 417. Due to the lower electric field, the breakdown voltage is increased. Thus, the doping levels in the semiconductor device can be higher than conventional devices, resulting in a reduced $R_{dson}$ of the power MOSFET. Moreover, the trench structure of the present invention results in a reduction in output capacitance of the power MOSFET. It is noted that while the drawings of the present embodiment have been discussed primarily in relation to a power MOSFET, the present inventive concepts apply to other semiconductor devices as well.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor device comprising:
a field plate trench;
a first trench dielectric situated in and contacting a bottom of said field plate trench;
a second trench dielectric situated over said first trench dielectric and directly contacting sidewalls of said field plate trench;
a field plate situated over said first trench dielectric and within said second trench dielectric;
a combined thickness of said first and second trench dielectrics at said bottom of said field plate trench being greater than a sidewall thickness of said second trench dielectric.

2. The power semiconductor device of claim 1, wherein said first trench dielectric is thermally grown in said field plate trench and said second trench dielectric is deposited in said field plate trench.

3. The power semiconductor device of claim 1, wherein said first trench dielectric is deposited in said field plate trench and said second trench dielectric is thermally grown in said field plate trench.

4. The power semiconductor device of claim 1, wherein a first dielectric material used in said first trench dielectric is different from a second dielectric material used in said second trench dielectric.

5. The power semiconductor device of claim 1, wherein said sidewalls of said field plate trench are at an angle of no less than 80 degrees and no more than 90 degrees with respect to a bottom surface of said power semiconductor device.

6. The power semiconductor device of claim 1, wherein said combined thickness is at least 120% greater than said sidewall thickness.

7. The power semiconductor device of claim 1, wherein said first trench dielectric completely fills said bottom of said field plate trench.

8. A method of fabricating a power semiconductor device, said method comprising:
forming a field plate trench in a semiconductor substrate;
forming a first trench dielectric;
forming a sacrificial mask within said first trench dielectric;
etching said first trench dielectric situated on said sidewalls to a depth;
removing said sacrificial mask;
depositing a second trench dielectric over said first trench dielectric, such that a combined thickness of said first and second trench dielectrics at a bottom of said field plate trench is greater than a sidewall thickness of said second trench dielectric;
forming a field plate in said field plate trench.

9. The method of claim 8, wherein said forming said sacrificial mask comprises:
depositing a sacrificial mask material into said field plate trench;
etching said sacrificial mask material.

10. The method of claim 8, wherein said forming said first trench dielectric includes thermally growing said first trench dielectric in said field plate trench.

11. The method of claim 8, wherein said forming said first trench dielectric includes depositing said first trench dielectric in said field plate trench.

12. The method of claim 8, wherein said forming said second trench dielectric includes depositing said second trench dielectric in said field plate trench.

13. The method of claim 8, wherein said combined thickness is at least 120% greater than said sidewall thickness.

14. A method of fabricating a power semiconductor device, said method comprising:
- forming a field plate trench;
- forming a first trench dielectric in and contacting a bottom of said field plate trench;
- partially etching said first trench dielectric on sidewalls of said field plate trench;
- forming a second trench dielectric over said first trench dielectric and directly contacting said sidewalls of said field plate trench without filling said field plate trench;
- forming a field plate in said field plate trench;
- wherein a combined thickness of said first and second trench dielectrics at a bottom of said field plate trench is greater than a sidewall thickness of said second trench dielectric.

15. The method of claim 14, wherein said forming said first trench dielectric includes depositing said first trench dielectric in said field plate trench.

16. The method of claim 15, wherein said depositing said first trench dielectric completely fills said field plate trench.

17. The method of claim 15, wherein said depositing said first trench dielectric partially fills said field plate trench.

18. The method of claim 14, wherein said forming said second trench dielectric includes depositing said second trench dielectric in said field plate trench.

19. The method of claim 14, wherein said forming said second trench dielectric includes thermally growing said second trench dielectric in said field plate trench.

20. The method of claim 14, wherein said combined thickness is at least 120% greater than said sidewall thickness.

* * * * *